United States Patent
Park et al.

(10) Patent No.: US 12,302,568 B2
(45) Date of Patent: May 13, 2025

(54) SEMICONDUCTOR MEMORY DEVICE INCLUDING A DISCHARGE CONTACT

(71) Applicant: SK hynix Inc., Icheon-si (KR)

(72) Inventors: Kwang Hwi Park, Icheon-si (KR); Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 482 days.

(21) Appl. No.: 17/721,226

(22) Filed: Apr. 14, 2022

(65) Prior Publication Data

US 2023/0180474 A1 Jun. 8, 2023

(30) Foreign Application Priority Data

Dec. 2, 2021 (KR) .................. 10-2021-0171059

(51) Int. Cl.
*H10B 43/27* (2023.01)
*H01L 23/60* (2006.01)
*H10B 41/27* (2023.01)
*H10B 43/40* (2023.01)
*H10B 43/10* (2023.01)
*H10B 43/50* (2023.01)

(52) U.S. Cl.
CPC ............. *H10B 43/27* (2023.02); *H01L 23/60* (2013.01); *H10B 41/27* (2023.02); *H10B 43/40* (2023.02); *H10B 43/10* (2023.02); *H10B 43/50* (2023.02)

(58) Field of Classification Search
CPC ........ H10B 43/27; H10B 43/40; H10B 43/10; H10B 43/35; H10B 43/50; H01L 23/535; H01L 23/60; H01L 25/18
See application file for complete search history.

(56) References Cited

U.S. PATENT DOCUMENTS

| | | | | |
|---|---|---|---|---|
| 2019/0371800 A1* | 12/2019 | Nishikawa | ............. | H10B 41/35 |
| 2020/0373321 A1* | 11/2020 | Kwak | ............. | G11C 16/24 |
| 2020/0381447 A1* | 12/2020 | Kim | ............. | H10B 43/27 |
| 2022/0052069 A1* | 2/2022 | Kim | ............. | H10B 43/27 |
| 2022/0139904 A1* | 5/2022 | Ok | ............. | H01L 23/5386 |
| | | | | 257/368 |
| 2023/0165007 A1* | 5/2023 | Jang | ............. | H10B 43/27 |
| | | | | 257/314 |
| 2024/0233824 A1* | 7/2024 | Lee | ............. | H10B 43/40 |

FOREIGN PATENT DOCUMENTS

| | | |
|---|---|---|
| KR | 10-2018-0122847 A | 11/2018 |
| KR | 10-2020-0137699 A | 12/2020 |

* cited by examiner

*Primary Examiner* — Ratisha Mehta
*Assistant Examiner* — Brad A Knudson

(57) ABSTRACT

A semiconductor memory device includes a memory structure including a plurality of memory cells which are disposed on a cell region of a source plate; a plurality of contact plugs passing through the source plate in a coupling region of the source plate including at least a portion of a center portion of the source plate, and separated from the source plate by a dielectric layer pattern; a discharge contact passing through the source plate in the coupling region, and coupled to the center portion of the source plate; and a discharge region coupled to the discharge contact. The discharge region is located in a substrate below the source plate.

13 Claims, 11 Drawing Sheets

SEMICONDUCTOR MEMORY DEVICE INCLUDING A DISCHARGE CONTACT

CROSS-REFERENCE TO RELATED APPLICATION

The present application claims priority under 35 U.S.C. § 119(a) to Korean Patent Application No. 10-2021-0171059 filed in the Korean Intellectual Property Office on Dec. 2, 2021, which is incorporated herein by reference in its entirety.

BACKGROUND

1. Technical Field

Various embodiments generally relate to a semiconductor technology, and more particularly, to a semiconductor memory device.

2. Related Art

As electronic devices using semiconductor memory devices continue to be miniaturized, increasing reductions in the area of the semiconductor memory devices are required. As a measure to meet such requirements, PUC (peripheral under cell) structures, in which circuits for controlling the operation of memory cells are disposed under the memory cells, have been proposed.

SUMMARY

Various embodiments are directed to providing a semiconductor memory device that contribute to the reduction of defects due to arcing.

In an embodiment, a semiconductor memory device may include: a memory structure including a plurality of memory cells that are disposed on a cell region of a source plate; a plurality of contact plugs passing through in the source plate in a coupling region of the source plate including at least a portion of a center portion of the source plate, and separated from the source plate by a dielectric layer pattern; a discharge contact passing through the source plate in the coupling region, and coupled to the center portion of the source plate; and a discharge region coupled to the discharge contact, and disposed in a substrate below the source plate.

In an embodiment, a semiconductor memory device may include: a memory structure including a plurality of memory cells that are disposed on a first region of a source plate; a first discharge contact passing through the source plate in a second region of the source plate including at least a portion of a center portion of the source plate, and coupled to the center portion of the source plate; a second discharge contact passing through the source plate at an edge portion of the source plate, and coupled to the edge portion of the source plate; and a discharge region in a substrate below the source plate, and coupled in common to the first discharge contact and the second discharge contact.

DETAILED DESCRIPTION

Figure 1:
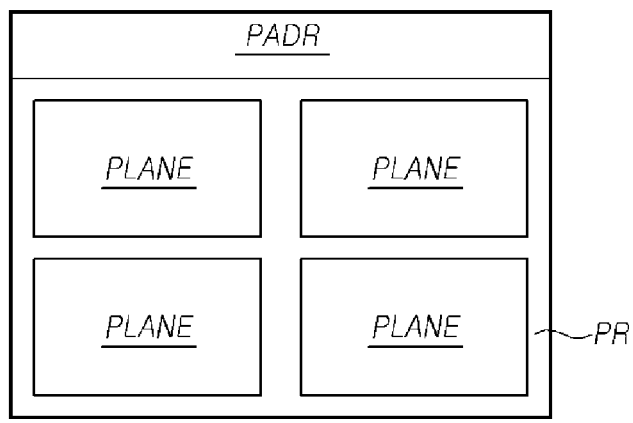
FIG. 1 is a view schematically illustrating a full chip structure of a semiconductor memory device in accordance with an embodiment of the present disclosure.
Figure 1:
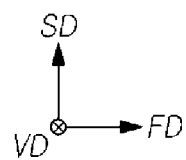

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the present disclosure will be described in detail with reference to the accompanying drawings.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other. In the drawings, a direction indicated by an arrow and a direction opposite thereto indicate the same direction.

FIG. 1 is a view schematically illustrating a full chip structure of a semiconductor memory device in accordance with an embodiment of the present disclosure.

Referring to FIG. 1, a semiconductor memory device 100 in accordance with an embodiment of the present disclosure may include a plurality of plane regions PLANE, a pad region PADR and a peripheral region PR.

FIG. 1 illustrates a four-plane structure, and the semiconductor memory device 100 includes four plane regions PLANE. Although FIG. 1 illustrates a case in which the semiconductor memory device 100 has a four-plane structure, the present disclosure is not limited thereto. In other embodiments, the semiconductor memory device 100 may have a single-plane structure including one plane or a multi-plane structure including at least two planes.

As will be described later with reference to FIG. 2, each plane region PLANE may include a memory cell array, a row decoder and a page buffer circuit.

Memory cell arrays included in different plane regions PLANE may be independently controlled. Word lines of the memory cell arrays included in the different plane regions PLANE may be independently activated by row decoders included in the plane regions PLANE, respectively. The memory cell arrays included in the different plane regions PLANE may be independently controlled in operations, such as write operations and read operations, by page buffer circuits included in the plane regions PLANE, respectively. The memory cell arrays included in the plane regions PLANE may perform a specific operation in parallel or operations different from each other by being independently controlled.

External coupling pads (not illustrated) may be disposed in the pad region PADR. Through the external coupling pads, the semiconductor memory device 100 may receive electrical signals, such as a command signal, an address signal and a control signal, from an external device, such as a memory controller. The semiconductor memory device 100 may exchange data with the external device. The peripheral region PR may be defined as a region other than the plane regions PLANE and the pad region PADR.

Figure 2:
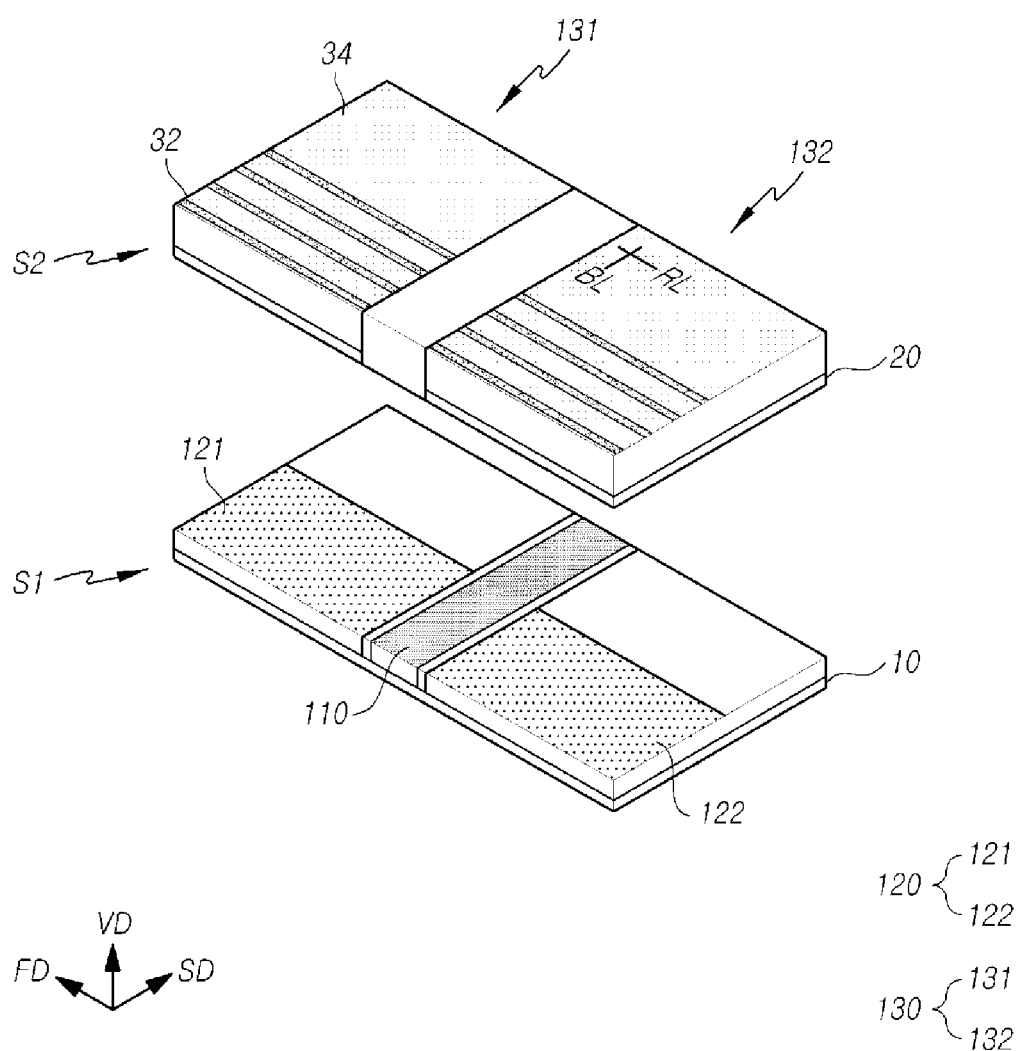
FIG. 2 is a view schematically illustrating a plane region of FIG. 1.

FIG. 2 is a view schematically illustrating a plane region PLANE of FIG. 1.

Referring to FIG. 2, a semiconductor memory device in accordance with an embodiment of the present disclosure may include a first semiconductor layer S1 and a second semiconductor layer S2. For better understanding, the illustrations in FIG. 2 show that the first semiconductor layer S1 and the second semiconductor layer S2 are separated from each other. However, it is to be understood that FIG. 2 is an exploded view and that the top surface of the first semiconductor layer S1 and the bottom surface of the second semiconductor layer S2 are in contact with each other.

The first semiconductor layer S1 may include a substrate 10, a logic circuit that is disposed on the substrate 10, a wiring structure (not illustrated) that is coupled to the logic circuit, and a dielectric layer (not illustrated) that covers the logic circuit and the wiring structure. The logic circuit may include a row decoder 110, a page buffer circuit 120 and a peripheral circuit (not illustrated).

The second semiconductor layer S2 may include a source plate 20 that is disposed on the first semiconductor layer S1 and a memory structure 130 that is disposed on the source plate 20. The memory structure 130 includes a memory cell array. The semiconductor memory device in accordance with the present embodiment may be provided as a PUC (peripheral under cell) structure.

The row decoder 110 may be configured to have a shape disposed at the center portion of the plane region PLANE and may extend in the second direction SD, which is a direction in which row lines RL are arranged.

The memory structure 130 may be divided into a first memory group 131 and a second memory group 132. The first memory group 131 and the second memory group 132 may be disposed on both sides, respectively, of the row decoder 110 when viewed from the top. For example, the memory cell array included in the memory structure 130 is divided into two parts that are included in the first memory group 131 and the second memory group 132. The source plate 20 may be divided into two parts corresponding to the first and second memory groups 131,132. Two part of the source plate 20 may be disposed both sides of the row decoder 110 in the first direction FD, when viewed from the top. The first and second memory groups 131,132 may be disposed on two portions of the source plate 20, respectively.

The page buffer circuit 120 may be divided into a first page buffer group 121 and a second page buffer group 122 to be disposed on both sides, respectively, of the row decoder 110. The first page buffer group 121 may be disposed in a region that overlaps with the first memory group 131 in the vertical direction VD, and may be configured to have substantially the same length as the first memory group 131 in the first direction FD, which is a direction in which bit lines BL are arranged. The second page buffer group 122 may be disposed in a region that overlaps with the second memory group 132 in the vertical direction VD, and may be configured to have substantially the same length as the second memory group 132 in the first direction FD.

The structure in which, as described above, the row decoder 110 is disposed at the center portion of the plane region PLANE and each of the page buffer circuit 120 and the memory structure 130 is divided into two and disposed on both sides, respectively, of the row decoder 110 may be defined as a center row decoder structure. Although FIG. 2 illustrates a center row decoder structure, the present disclosure is not limited thereto. Although not illustrated, as another example, a page buffer circuit and a memory structure may be disposed at the center portion of a plane region, and a row decoder may be divided into two parts and disposed on both sides, respectively, of the page buffer circuit and the memory structure.

The row decoder 110 may be coupled to the row lines RL of the first and second memory groups 131 and 132. The row decoder 110 may transfer operating voltages, provided from the peripheral circuit, to the first and second memory groups 131 and 132.

The first page buffer group 121 may include a plurality of page buffers that are coupled to the bit lines BL of the first memory group 131. The second page buffer group 122 may include a plurality of page buffers that are coupled to the bit lines BL of the second memory group 132.

The page buffer may receive a page buffer control signal from the peripheral circuit and may transmit and receive a data signal to and from the peripheral circuit. The page buffer may control the bit lines BL, coupled to memory cells, in response to the page buffer control signal. For example, the page buffer may detect data, stored in a memory cell, by sensing a signal of the bit line BL in response to the page buffer control signal, and may transmit the data signal to the peripheral circuit according to the detected data. The page buffer may apply a signal to the bit line BL on the basis of a data signal received from the peripheral circuit, in response to the page buffer control signal, and thereby, may write data to a memory cell. The page buffer may write data to or read data from a memory cell that is coupled to a word line activated by the row decoder 110.

Each of the first and second memory groups 131 and 132 may include a plurality of dielectric parts 32 and a plurality of cell parts 34, which are disposed on the source plate 20, and a plurality of bit lines BL.

Each dielectric part 32 may include a dielectric material and provides a space through which a contact plug passes. As will be described later with reference to FIG. 3, the contact plug may pass through the dielectric part 32 and the source plate 20, lying under the dielectric part 32, in the vertical direction VD to extend to the first semiconductor layer S1.

As will be described later with reference to FIG. 3, each cell part 34 may include a plurality of electrode layers and a plurality of interlayer dielectric layers, which are alternately stacked, and a plurality of cell plugs that pass through the plurality of electrode layers and the plurality of interlayer dielectric layers to extend to the source plate 20. The plurality of cell plugs may be coupled with the plurality of electrode layers to configure a plurality of memory cells, which are three-dimensionally arranged. The plurality of bit lines BL may be disposed on a plurality of dielectric parts 32 and a plurality of cell parts 34. Each of the plurality of bit lines BL may be coupled to a corresponding cell plug through a bit line contact.

The bit lines BL of the first memory group 131 may be coupled to the page buffers of the first page buffer group 121 through contact plugs that pass through the dielectric parts 32 of the first memory group 131. The contact plugs which pass through the dielectric parts 32 of the first memory group 131 may couple the bit lines BL of the first memory group 131 and the page buffers of the first page buffer group 121. Similarly, the bit lines BL of the second memory group 132 may be coupled to the page buffers of the second page buffer group 122 through contact plugs that pass through the dielectric parts 32 of the second memory group 132. The contact plugs which pass through the dielectric parts 32 of the second memory group 132 may couple the bit lines BL of the second memory group 132 and the page buffers of the second page buffer group 122.

The dielectric parts 32 of the first memory group 131 may be disposed in a region that overlaps with the first page buffer group 121 in the vertical direction VD, and may be configured to each have a line shape extending in the direction in which the bit lines BL are arranged. The dielectric parts 32 of the second memory group 132 may be disposed in a region that overlaps with the second page buffer group 122 in the vertical direction VD, and may be configured to each have a line shape extending in the direction in which the bit lines BL are arranged.

Although not illustrated, the page buffers included in each of the first and second page buffer groups 121 and 122 may be disposed in a plurality of rows that are arranged in the second direction SD. The dielectric parts 32 of each of the memory groups 131 and 132 may be disposed to be spaced apart from each other in the second direction SD, which is a direction in which the rows of the page buffers are arranged. At least one of the dielectric parts 32 of the first memory group 131 may be disposed on a region including the center portion of corresponding one among two parts of the source plate 20. At least one of the dielectric parts 32 of the second memory group 132 may be disposed on a region including the center portion of corresponding one among two parts of the source plate 20.

The first semiconductor layer 51 and the second semiconductor layer S2 may be fabricated on a single wafer. For example, after the logic circuit (including the row decoder 110, the page buffer circuit 120 and the peripheral circuit, which are not illustrated in FIG. 2) is formed on the substrate 10, and after forming the wiring structure coupled to the logic circuit and the dielectric layer that covers the wiring structure and the logic circuit, the source plate 20 may be formed on the dielectric layer of the first semiconductor layer S1, and the memory structure 130 may be built up on the source plate 20.

The source plate 20 is disposed on the dielectric layer of the first semiconductor layer S1 and thus is electrically floated during the manufacturing process. As a result, electric charges generated during the manufacturing process might not be discharged to an external element and the charges may accumulate in the source plate 20, which may result in occurrences of arcing. For example, while performing plasma etching of a plurality of sacrificial layers and a plurality of interlayer dielectric layers stacked on the source plate 20 in order to form holes or spaces for the cell plugs, charges may accumulate in the source plate 20 and arcing may occur.

If arcing occurs, then problems may arise in that contaminant particles that cause defects increase and can result in damage to a wafer or the malfunction of process equipment. Embodiments of the present disclosure describe measures capable of preventing arcing.

Figure 3:
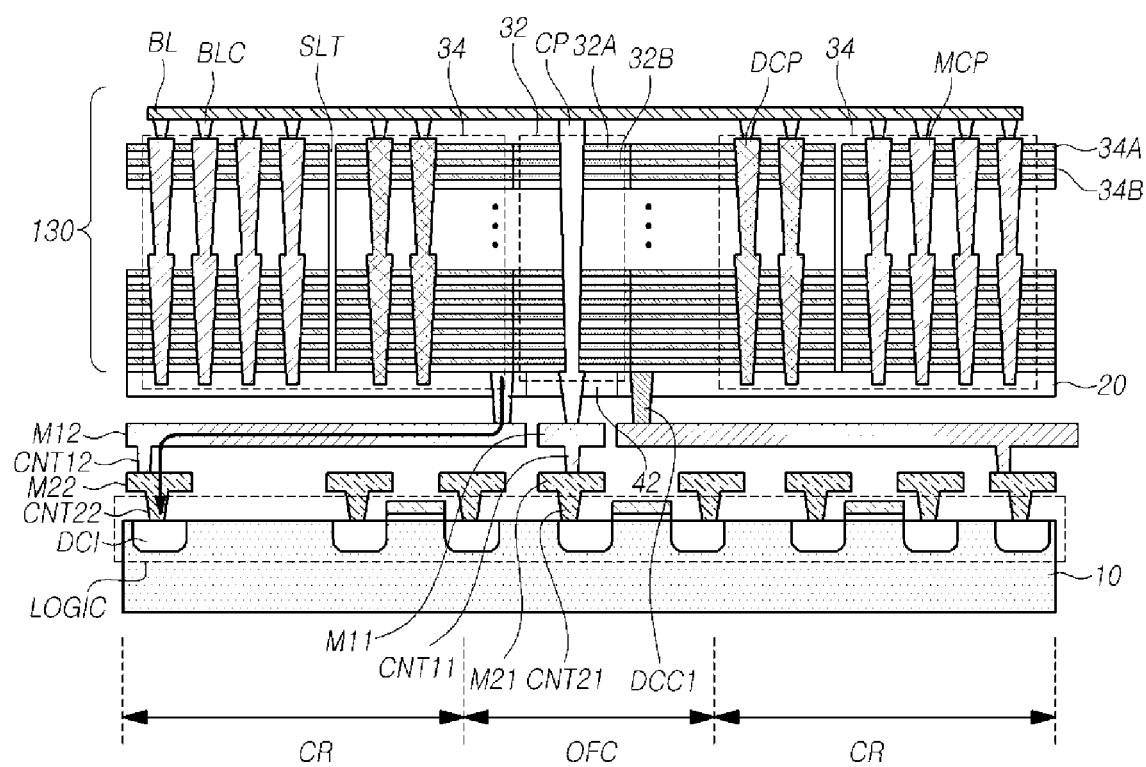
FIG. 3 is a cross-sectional view illustrating a semiconductor memory device in accordance with an embodiment of the present disclosure.
Figure 4:
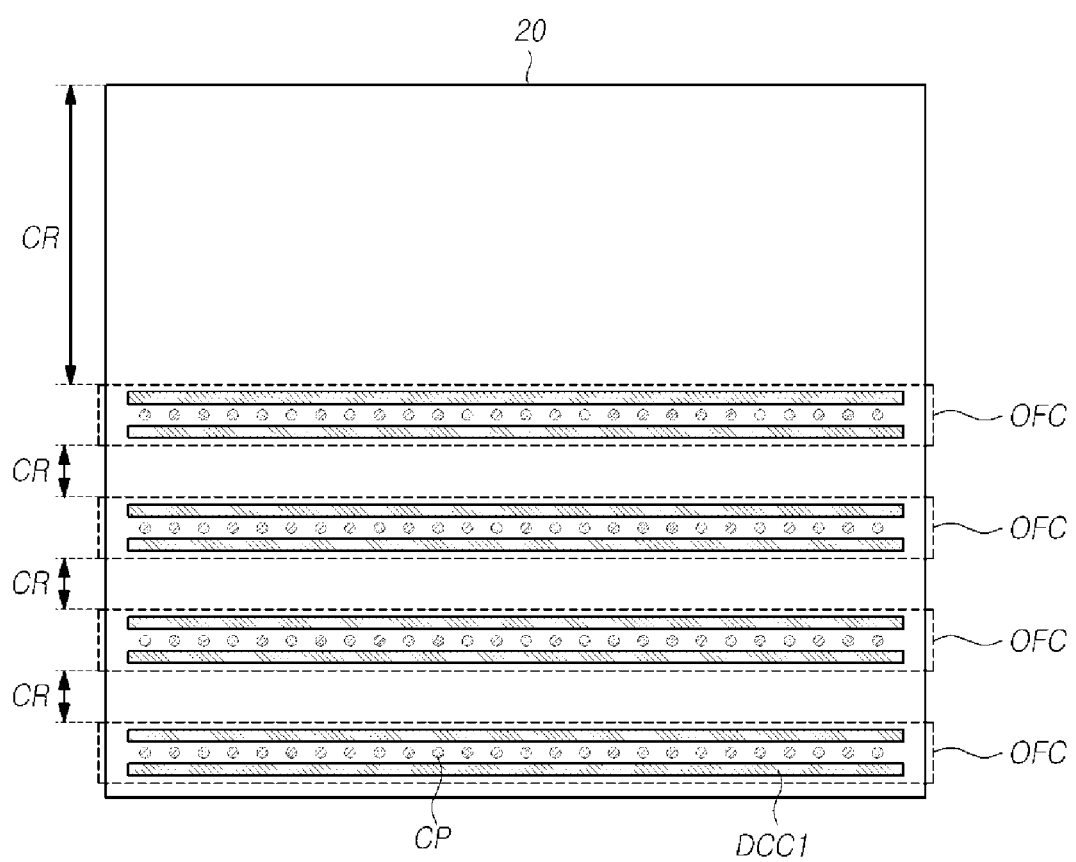
FIG. 4 is a top view illustrating a source plate of a semiconductor memory device in accordance with an embodiment of the present disclosure.
Figure 5:
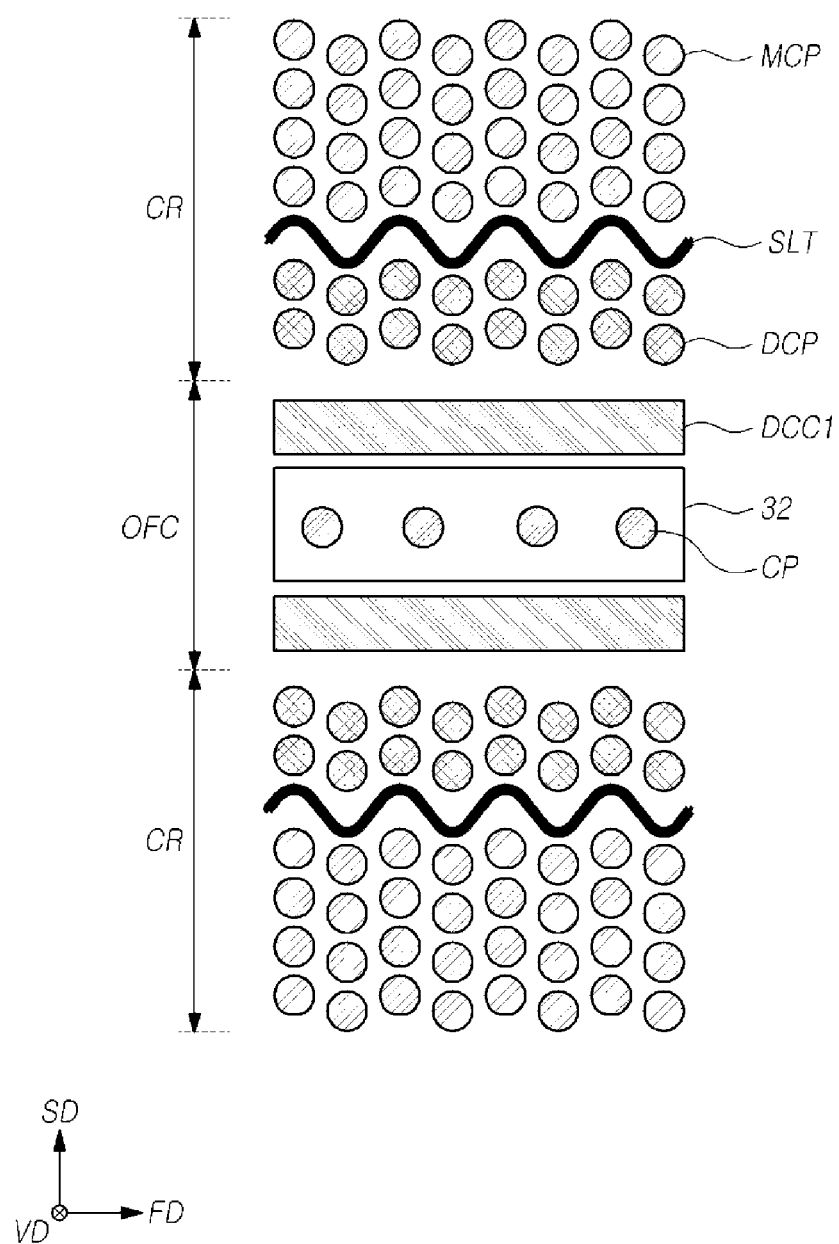
FIG. 5 is a top view illustrating a partial configuration of FIG. 3.

FIG. 3 is a cross-sectional view illustrating a semiconductor memory device in accordance with an embodiment of the present disclosure, FIG. 4 is a top view illustrating a source plate of a semiconductor memory device in accordance with an embodiment of the present disclosure, and FIG. 5 is a top view illustrating a partial configuration of FIG. 3. FIG. 3 may be a cross-sectional view taken along the second direction SD of FIG. 2. In this case, the memory structure 130 described later may correspond to the first memory group 131 or the second memory group 132 in FIG.

2. But, FIG. 3 should not be interpreted only as a cross section of FIG. 2, since an embodiment of the present disclosure is not limited to the center row decoder structure shown in FIG. 2.

Referring to FIG. 3, a semiconductor memory device in accordance with an embodiment of the present disclosure may include a memory structure 130, which includes a plurality of memory cells disposed on a cell region CR of the source plate 20. A plurality of contact plugs CP pass through the source plate 20 in a coupling region OFC of the source plate 20, which includes at least a portion of the center portion of the source plate 20. The plurality of contact plug CP may be separated from the source plate 20 by a dielectric layer pattern 42. First discharge contacts DCC1, which pass through the source plate 20 in the coupling region OFC, are coupled to the center portion of the source plate 20; and discharge regions DCI, which are configured in the substrate 10 below the source plate 20, are coupled to the first discharge contacts DCC1.

The source plate 20 may include a semiconductor material, such as, a group IV semiconductor, a group III-V compound semiconductor or a group II-VI compound semiconductor. As examples, the group IV semiconductor may include silicon, germanium or silicon-germanium.

Referring to FIG. 4, the source plate 20 may include a plurality of coupling regions OFC and a plurality of cell regions CR. At least one of the plurality of coupling regions OFC may include at least a portion of the center portion of the source plate 20.

In the coupling region OFC, the plurality of contact plugs CP may pass through the memory structure 130 and the source plate 20 in the vertical direction VD.

The first discharge contacts DCC1 may pass through the source plate 20 in the vertical direction VD in the coupling regions OFC and may be coupled to the source plate 20. At least one of the first discharge contacts DCC1 may pass through the center portion of the source plate 20 and be coupled to the center portion of the source plate 20.

The first discharge contact DCC1 may be disposed at an edge portion of a coupling region OFC adjacent to a cell region CR. When viewed from the top, the first discharge contact DCC1 may be configured to have a line shape extending in the first direction FD, which is also the direction in which the bit lines BL are arranged.

Referring back to FIG. 3, a dielectric part 32 of the memory structure 130 may include a plurality of first dielectric layers 32A and a plurality of second dielectric layers 32B, which are alternately stacked on the coupling region OFC of the source plate 20. The first dielectric layers 32A may include silicon nitride, and the second dielectric layers 32B may include silicon oxide.

The contact plug CP may be coupled to a wiring line M11 of a wiring layer below the source plate 20 by passing through the dielectric part 32 and the source plate 20 in the coupling region OFC, and may be coupled to a logic circuit LOGIC, defined on the substrate 10, through contacts CNT11 and CNT21 and a wiring line M21, which are coupled to the wiring line M11. The dielectric layer pattern 42 may be formed between the contact plug CP and the source plate 20 to insulate the contact plug CP and the source plate 20. For example, the contact plug CP may couple the bit line BL and the page buffer circuit of the logic circuit LOGIC.

A cell part 34 of the memory structure 130 may include a plurality of electrode layers 34A and a plurality of interlayer dielectric layers 34B which are alternately stacked, and a plurality of cell plugs MCP and DCP, which pass through the plurality of electrode layers 34A and the plurality of interlayer dielectric layers 34B in the vertical direction VD in the cell region CR to extend to the source plate 20.

The electrode layers 34A may include a conductive material. For example, the electrode layers 34A may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The electrode layers 34A may configure row lines. Among the electrode layers 34A, at least one electrode layer 34A from the lowermost electrode layer 34A may configure a source select line. Among the electrode layers 34A, at least one electrode layer 34A from the uppermost electrode layer 34A may configure a drain select line. The electrode layers 34A between the source select line and the drain select line may configure word lines. The interlayer dielectric layers 34B may include silicon oxide.

Each of the plurality of electrode layers 34A may be disposed at the same layer as each corresponding layer in the plurality of first dielectric layers 32A. Each of the plurality of interlayer dielectric layers 34B may be disposed at the same layer as each corresponding layer in the plurality of second dielectric layers 32B. Each of the plurality of interlayer dielectric layers 34B may be formed in the same process as each of the plurality of second dielectric layers 32B. The second dielectric layer 32B and the interlayer dielectric layer 34B, which is correspond to each other and are positioned at the same layer or vertical position, may be integrally formed.

Although not illustrated, each of the cell plugs MCP and DCP may include a channel layer and a gate dielectric layer. The channel layer may include polysilicon or monocrystalline silicon, and may include, in some regions, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

The cell plugs MCP and DCP may include main cell plugs MCP and dummy cell plugs DCP. A bit line contact BLC may be formed on the main cell plug MCP to couple the main cell plug MCP and the bit line BL. A source select transistor may be configured in areas or regions where the source select line surrounds the main cell plug MCP. A memory cell may be configured in areas or regions where the word line surrounds the main cell plug MCP. A drain select transistor may be configured in areas or regions where the drain select line surrounds the main cell plug MCP.

Each of the dummy cell plugs DCP may have the same or similar structure and shape as each of the main cell plugs MCP, but is however may not substantially perform a function as a main cell plug MCP and may exist only as a pattern. An electrical signal may not be applied to each of the dummy cell plugs DCP. Thus, a bit line contact may not be formed on the dummy cell plug DCP and the dummy cell plug DCP may not be coupled to the bit line BL.

Referring to FIGS. 3 and 5, the dummy cell plugs DCP may be disposed at an edge portion of the cell region CR adjacent to the first discharge contact DCC1. The main cell plugs MCP may be separated from the first discharge contact DCC1 in the second direction SD with the dummy cell plugs DCP interposed therebetween. A slit SLT, which divides the plurality of electrode layers 34A and the plurality of interlayer dielectric layers 34B, may be formed between the main cell plugs MCP and the dummy cell plugs DCP. The slit SLT may extend in the vertical direction VD and the first direction FD. FIG. 5 illustrates a case in which the slit SLT extends in a zigzag or waveform style in the first direction FD, but the present disclosure is not limited thereto. For example, the slit SLT may extend in a straight line in the first direction FD.

The first discharge contact DCC1 may be formed of a conductive material that has a larger work function than the source plate 20. For example, the first discharge contact DCC1 may include at least one selected from a metal (e.g., tungsten, copper or aluminum) and a transition metal (e.g., titanium or tantalum). The lower end of the first discharge contact DCC1 may be coupled to a wiring line M12, which is defined in the wiring layer below the source plate 20.

The discharge region DCI may be formed by implanting impurity ions, of a conductivity type different from that of the substrate 10, into the substrate 10. For example, the substrate 10 may be an n-type semiconductor substrate, and the discharge region DCI may be a p-type impurity region that is formed by implanting p-type impurity ions into the n-type semiconductor substrate. The discharge region DCI and the substrate 10 may configure a PN diode.

Contacts CNT12 and CNT22 and a wiring line M22 may be defined on or over the discharge region DCI to couple the discharge region DCI and the wiring line M12. The contacts CNT12 and CNT22 and the wiring lines M12 and M22 may be formed of a conductive material that has a larger work function than the source plate 20. For example, the contacts CNT12 and CNT22 and the wiring lines M12 and M22 may include at least one selected among metals, such as, tungsten, copper and aluminum.

The charges of the center portion of the source plate 20 may be discharged to the discharge region DCI through the first discharge contact DCC1, the contacts CNT12 and CNT22 and the wiring lines M12 and M22, all of which have work functions larger than the source plate 20.

The cell plugs MCP and DCP extend to the source plate 20 through the plurality of electrode layers 34A and the plurality of interlayer dielectric layers 34B and the first discharge contact DCC1 passes through the source plate 20. In order to prevent a defect in which the cell plugs MCP and DCP and the first discharge contact DCC1 are coupled to each other, it is necessary to form the cell plugs MCP and DCP to avoid the first discharge contact DCC1. Unlike embodiments in this disclosure, when the first discharge contact DCC1 is disposed in the cell region CR, the cell plugs MCP and DCP cannot be formed at and around a portion where the first discharge contact DCC1 is positioned. Therefore, as the number of memory cells to be disposed in the cell region CR decreases, memory capacity may decrease.

According to embodiments of the present disclosure, by forming the first discharge contact DCC1 in the coupling region OFC, it is not necessary to reduce the number of memory cells. In addition, without causing a decrease in memory capacity, the charges of the center portion of the source plate 20 may be discharged to prevent arcing.

Figure 6:
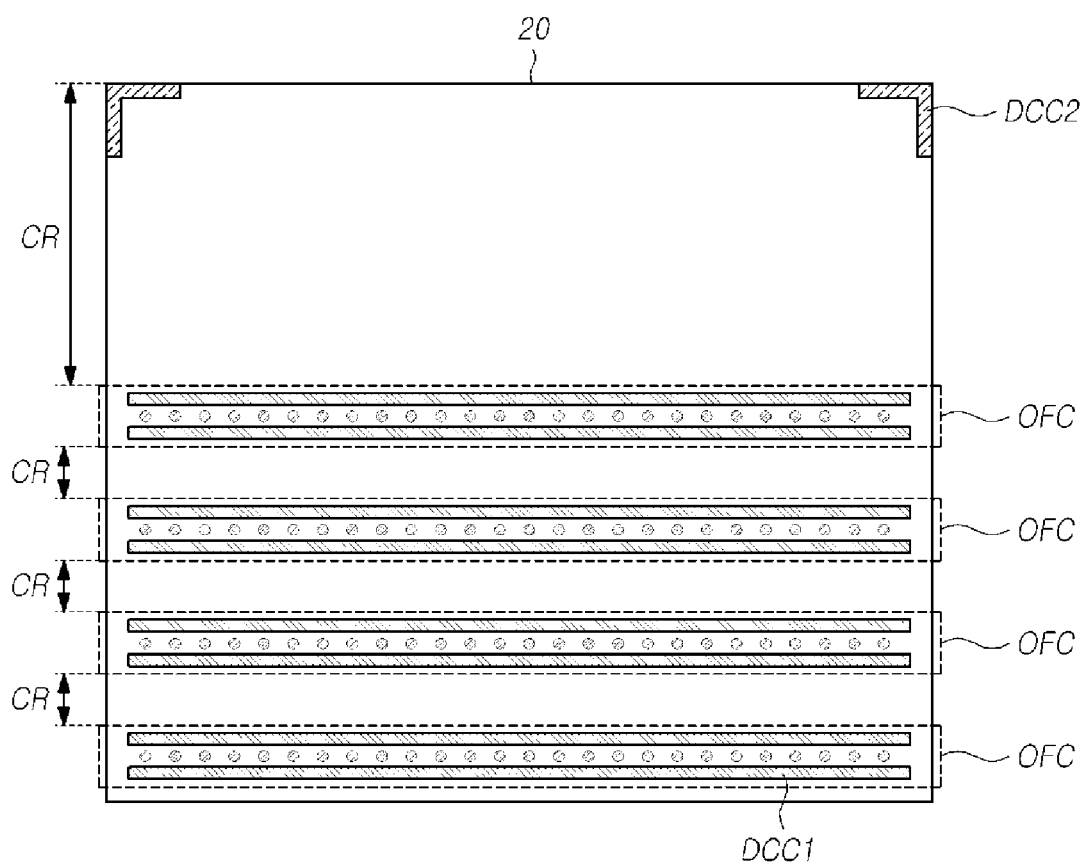
FIG. 6 is a top view illustrating a source plate of a semiconductor memory device in accordance with another embodiment of the present disclosure.
Figure 7:
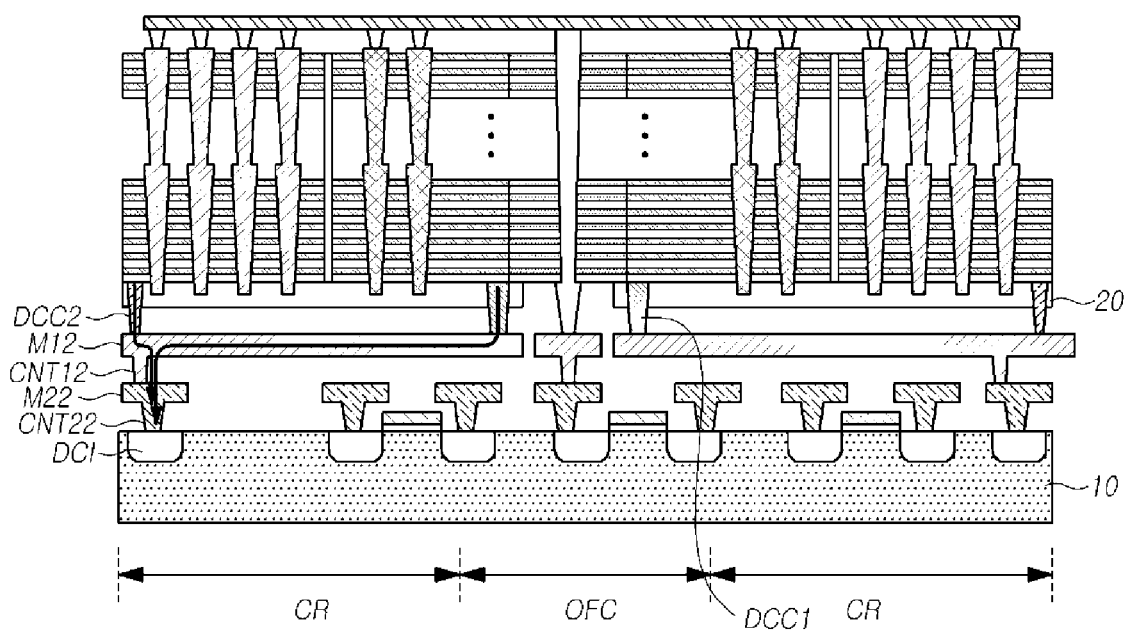
FIG. 7 is a cross-sectional view illustrating a semiconductor memory device of FIG. 6.
Figure 7:
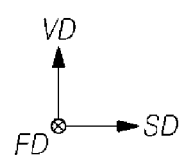

FIG. 6 is a top view illustrating a source plate of a semiconductor memory device in accordance with another embodiment of the present disclosure, and FIG. 7 is a cross-sectional view illustrating a semiconductor memory device of FIG. 6.

Referring to FIGS. 6 and 7, a second discharge contact DCC2 may be formed at an edge portion of a source plate 20. The second discharge contact DCC2 may pass through the edge portion of the source plate 20 and may be coupled to the edge portion of the source plate 20.

The second discharge contact DCC2 may be formed of a conductive material that has a larger work function than the source plate 20. For example, the second discharge contact DCC2 may include at least one selected from a metal (e.g., tungsten, copper or aluminum) and a transition metal (e.g., titanium or tantalum).

The second discharge contact DCC2 may be coupled to the discharge region DCI through the wiring lines M12 and M22 and the contacts CNT12 and CNT22. The charges generated during manufacturing of the semiconductor memory device may be discharged to the discharge region DCI through the second discharge contact DCC2, the wiring lines M12 and M22 and the contacts CNT12 and CNT22, all of which have work functions larger than the source plate 20.

The discharge region DCI may be disposed to overlap with the second discharge contact DCC2 in the vertical direction VD. By disposing the discharge region DCI to overlap with the second discharge contact DCC2 in the vertical direction VD, the shortest discharge path that couples the second discharge contact DCC2 and the discharge region DCI may be configured.

The source plate 20 is formed of a material which has a relatively large work function, and as a result, the charges of the center portion of the source plate 20, which is thus farther away from the second discharge contact DCC2, may not be discharged through the second discharge contact DCC2. In embodiments of the present disclosure, however, additional first discharge contacts DCC1 coupled to the center portion of the source plate 20 may be formed, and the charges of the center portion of the source plate 20 may be discharged through the first discharge contact DCC1.

The first discharge contact DCC1 may be coupled to the wiring line M12 and may be coupled to the discharge region DCI through the contacts CNT12 and CNT22 and the wiring line M22, which are coupled to the wiring line M12. The first discharge contact DCC1 and the second discharge contact DCC2 may be coupled in common to one discharge region DCI to share the one discharge region DCI.

According to the present embodiment, the first discharge contact DCC1 shares one discharge region DCI with the second discharge contact DCC2, and thus there is no need to change the design of the substrate 10. In comparison, when a separate discharge region coupled to the first discharge contact DCC1 is formed in the substrate 10 to discharge the charges of the center portion of the source plate 20, the design of the substrate 10 may need to change. Therefore, in FIGS. 6 and 7, the charges of the center portion of the source plate 20 can be discharged to prevent arcing without consuming efforts and time for a design change.

Figure 8:
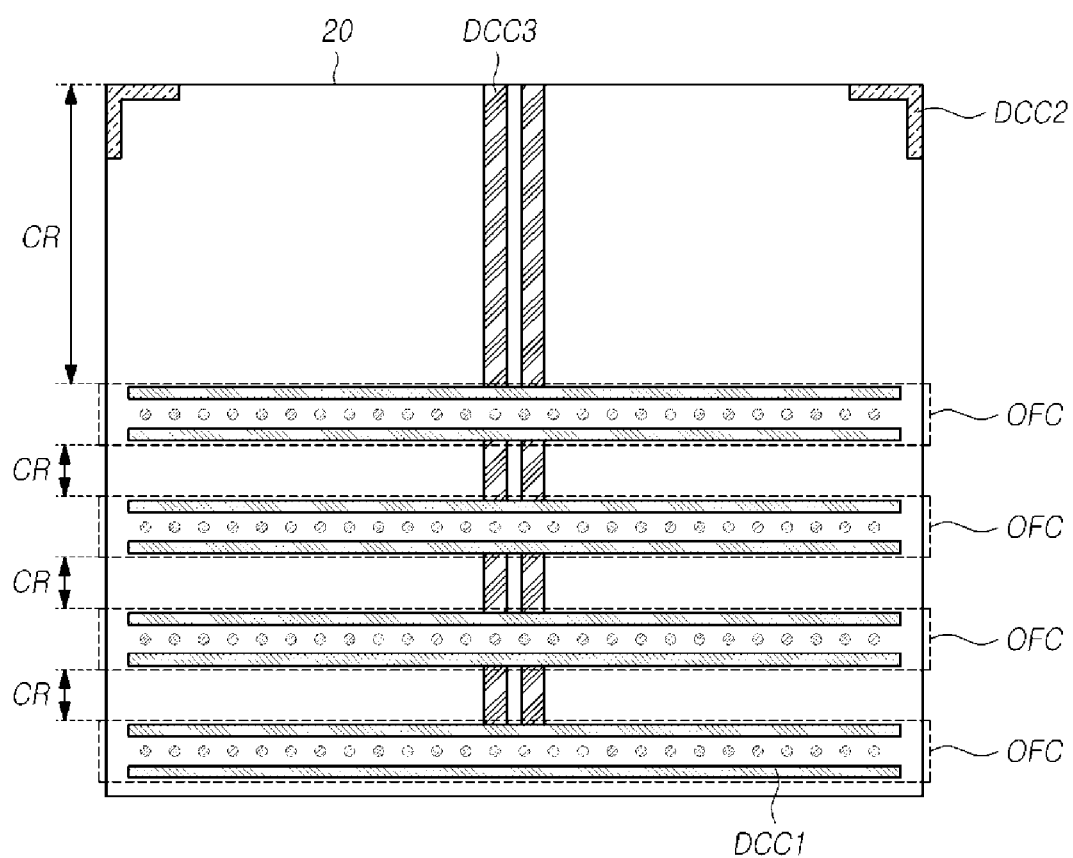
FIG. 8 is a top view illustrating a source plate of a semiconductor memory device in accordance with still another embodiment of the present disclosure.
Figure 9:
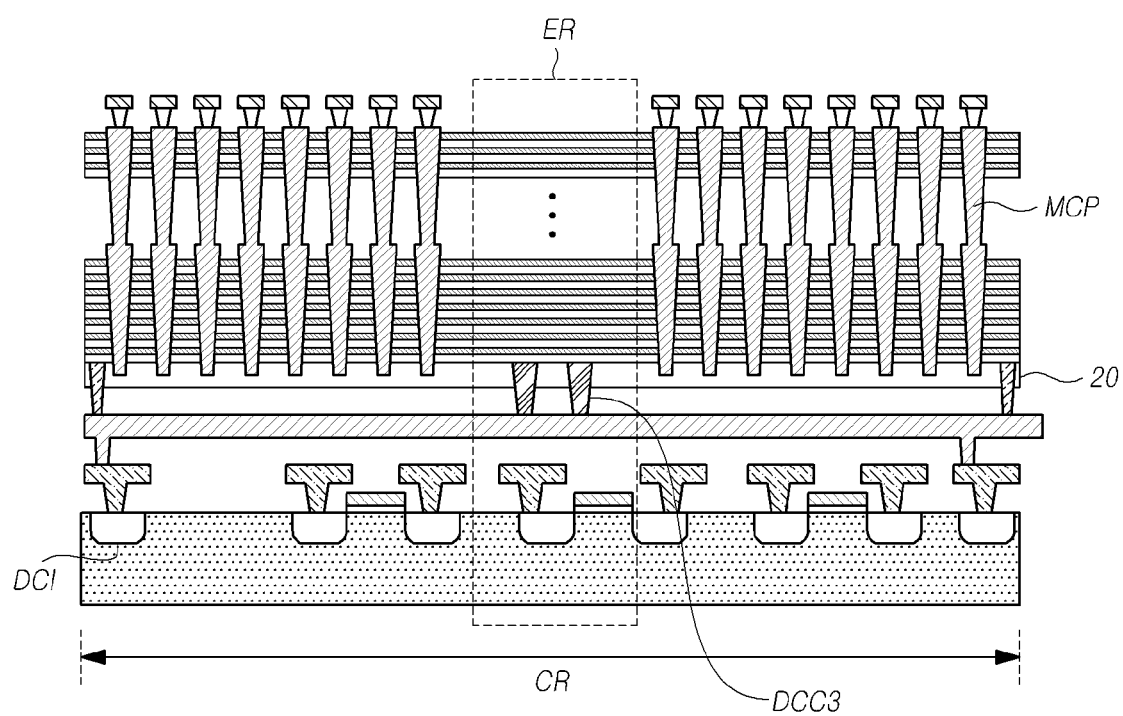
FIG. 9 is a cross-sectional view illustrating the semiconductor memory device of FIG. 8.
Figure 9:
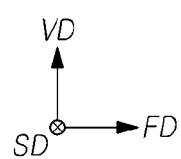

FIG. 8 is a top view illustrating a source plate of a semiconductor memory device in accordance with still another embodiment of the present disclosure, and FIG. 9 is a cross-sectional view illustrating the semiconductor memory device of FIG. 8.

Referring to FIG. 8, a third discharge contact DCC3 may be formed passing through the source plate 20 in the vertical direction VD at the center portion of the source plate 20. The third discharge contact DCC3 is coupled to the center portion of the source plate 20 and the first discharge contacts DCC1. The third discharge contact DCC3 may be formed to have a line shape which intersect with the first discharge contacts DCC1. For example, the first discharge contact DCC1 may be formed to have a line shape which extends in the first direction FD, and the third discharge contact DCC3 may be formed to have a line shape that extends in the second direction SD. At least one of the first discharge contacts DCC1 may traverse the center portion of the source plate 20 in the first direction FD, and the third discharge contact DCC3 may traverse the center portion of the source plate 20 in the second direction SD.

Referring to FIGS. 8 and 9, the cell region CR may include an empty region ER. The main cell plugs MCP and the dummy cell plugs (not illustrated) may be disposed in the cell region CR, but not in the empty region ER. The empty region ER may be defined as a region of the cell region CR in which the main cell plugs MCP and the dummy cell plugs (not illustrated) are not arrayed. The third discharge contact DCC3 may be disposed in the empty region ER.

The third discharge contact DCC3 may be formed of a conductive material that has a larger work function than the source plate 20. For example, the third discharge contact DCC3 may include at least one selected from a metal (e.g., tungsten, copper or aluminum) and a transition metal (e.g., titanium or tantalum).

The third discharge contact DCC3 may be coupled to the first discharge contact DCC1 and may be coupled to the discharge region DCI through the first discharge contact DCC1. The charges generated during manufacturing of the semiconductor memory device may be discharged to the discharge region DCI through the third discharge contact DCC3, which has a work function larger than the source plate 20.

Figure 10:
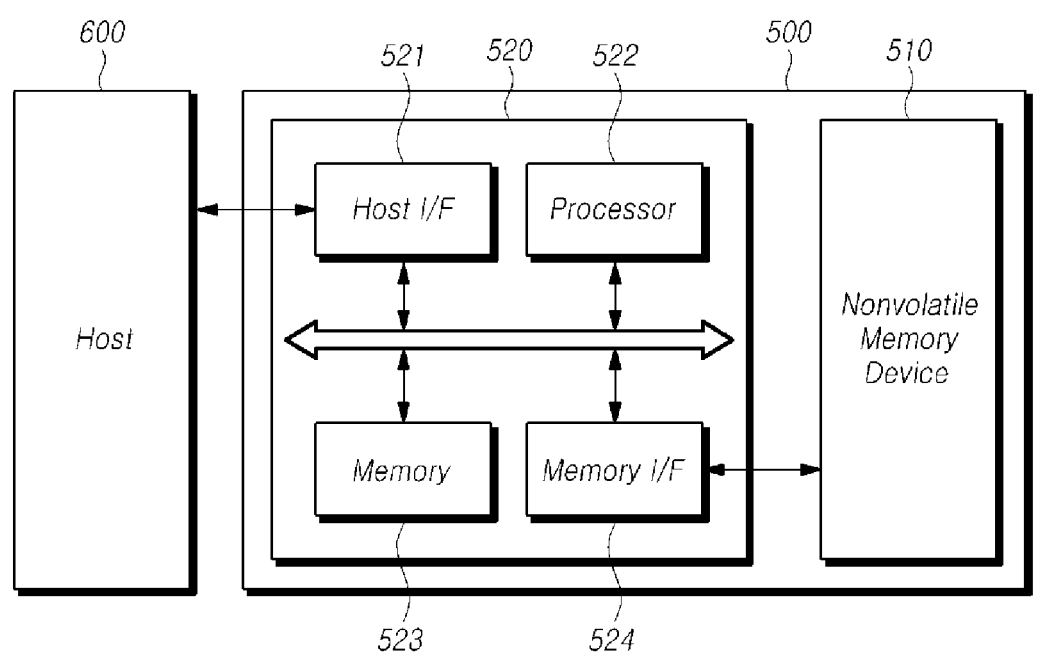
FIG. 10 is a block diagram schematically illustrating a memory system including a semiconductor memory device in accordance with embodiments of the present disclosure.

FIG. 10 is a block diagram schematically illustrating a memory system including a semiconductor memory device in accordance with embodiments of the present disclosure.

Referring to FIG. 10, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

While FIG. 10 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the semiconductor memory device according to the embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface 521, a processor 522, the memory 523 and a memory interface 524. Although not illustrated in FIG. 10, the controller 520 may further include an ECC (error correction code) engine which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 11:
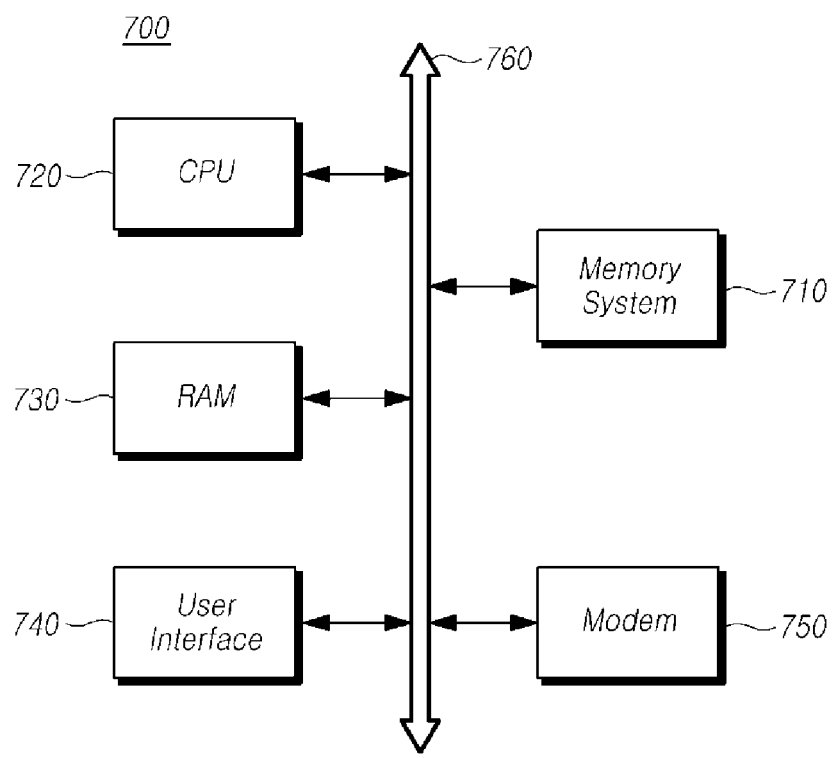
FIG. 11 is a block diagram schematically illustrating a computing system including a semiconductor memory device in accordance with embodiments of the present disclosure.

FIG. 11 is a block diagram schematically illustrating a computing system including a semiconductor memory device in accordance with embodiments of the disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although the detailed description of the present invention described above has been described with reference to the embodiments of the present invention, those skilled in the art or those having ordinary skill in the art will understand that the present invention can be variously modified and changed without departing from the spirit and scope of the present invention described in the claims to be described later.

What is claimed is:

1. A semiconductor memory device comprising:
a memory structure including a plurality of memory cells that are disposed on a cell region of a source plate;
a plurality of contact plugs passing through the source plate in a coupling region of the source plate including at least a portion of a center portion of the source plate, and separated from the source plate by a dielectric layer pattern;
a discharge contact passing through the source plate in the coupling region;
a discharge region coupled to the discharge contact, and disposed in a substrate below the source plate; and
an additional discharge contact passing through the source plate at the center portion of the source plate, intersecting with the discharge contact, and coupled to the discharge contact and the center portion of the source plate.

2. The semiconductor memory device according to claim 1, wherein
the memory structure further includes a plurality of bit lines that are coupled to the plurality of memory cells, and
the plurality of contact plugs couple a page buffer circuit defined on the substrate and the plurality of bit lines.

3. The semiconductor memory device according to claim 1, wherein
the memory structure further includes a plurality of bit lines that are coupled to the plurality of memory cells and are arranged in a first direction parallel to a top surface of the source plate, and
the discharge contact has a line shape that extends in the first direction.

4. The semiconductor memory device according to claim 1, wherein the discharge contact is disposed at an edge portion of the coupling region adjacent to the cell region.

5. The semiconductor memory device according to claim 1,
wherein the memory structure comprises:
a dielectric part that is disposed on the coupling region of the source plate and through which the plurality of contact plugs pass; and
a cell part including a plurality of electrode layers and a plurality of interlayer dielectric layers that are alternately stacked on the cell region of the source plate, and a plurality of cell plugs that pass through the plurality of electrode layers and the plurality of interlayer dielectric layers to extend to the source plate, and
wherein the plurality of cell plugs comprise:
a plurality of dummy cell plugs disposed at an edge portion of the cell region adjacent to the discharge contact; and
a plurality of main cell plugs separated from the discharge contact by the plurality of dummy cell plugs.

6. The semiconductor memory device according to claim 1,
wherein the memory structure further comprises:
a plurality of electrode layers and a plurality of interlayer dielectric layers alternately stacked on the cell region of the source plate; and
a plurality of cell plugs passing through the plurality of electrode layers and the plurality of interlayer dielectric layers to extend to the source plate,
wherein the cell region includes an empty region, and
wherein the plurality of cell plugs are disposed in the cell region except the empty region, and an additional discharge contact is disposed in the empty region.

7. The semiconductor memory device according to claim 1, wherein
the memory structure further includes a plurality of bit lines that are coupled to the plurality of memory cells,
the discharge contact has a line shape that extends in a direction in which the plurality of bit lines are arranged when viewed from the top, and
the additional discharge contact has a line shape which extends in a direction in which the plurality of bit lines extend when viewed from the top.

8. A semiconductor memory device comprising:
a memory structure including a plurality of memory cells that are disposed on a first region of a source plate;
a first discharge contact passing through the source plate in a second region of the source plate including at least a portion of a center portion of the source plate, and coupled to the center portion of the source plate;
a second discharge contact passing through the source plate at an edge portion of the source plate, and coupled to the edge portion of the source plate;

a discharge region in a substrate below the source plate and coupled in common to the first discharge contact and the second discharge contact; and a third discharge contact passing through the source plate at the center portion of the source plate, intersecting with the first discharge contact, and coupled to the first discharge contact and the center portion of the source plate.

9. The semiconductor memory device according to claim 8, wherein the discharge region overlaps with the second discharge contact in a vertical direction perpendicular to a top surface of the source plate.

10. The semiconductor memory device according to claim 8, wherein the memory structure further includes a plurality of bit lines that are coupled to the plurality of memory cells, and the first discharge contact has a line shape that extends in a direction in which the plurality of bit lines are arranged when viewed from the top.

11. The semiconductor memory device according to claim 8, wherein the first discharge contact is disposed at an edge portion of the second region adjacent to the first region.

12. The semiconductor memory device according to claim 8,
wherein the memory structure comprises:

a plurality of electrode layers and a plurality of interlayer dielectric layers alternately stacked on the first region of the source plate; and a plurality of cell plugs passing through the plurality of electrode layers and the plurality of interlayer dielectric layers to extend to the source plate, wherein the first region includes an empty region, and wherein the plurality of cell plugs are disposed in the first region but not in the empty region, and the third discharge contact is disposed in the empty region.

13. The semiconductor memory device according to claim 8, wherein the memory structure further includes a plurality of bit lines that are coupled to the plurality of memory cells, and the first discharge contact has a line shape that extends in a direction in which the plurality of bit lines are arranged when viewed from the top, and the third discharge contact has a line shape that extends in a direction in which the plurality of bit lines extend when viewed from the top.

* * * * *